United States Patent
Wang et al.

(10) Patent No.: US 9,659,851 B2
(45) Date of Patent: May 23, 2017

(54) METHOD AND APPARATUS FOR IMPROVING THE RELIABILITY OF A CONNECTION TO A VIA IN A SUBSTRATE

(71) Applicant: Marvell World Trade Ltd., St. Michael (BB)

(72) Inventors: Long-Ching Wang, Cupertino, CA (US); Albert Wu, Palo Alto, CA (US); Scott Wu, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 159 days.

(21) Appl. No.: 14/613,218

(22) Filed: Feb. 3, 2015

(65) Prior Publication Data
US 2015/0228569 A1 Aug. 13, 2015

Related U.S. Application Data

(60) Provisional application No. 61/937,331, filed on Feb. 7, 2014.

(51) Int. Cl.
*H01L 23/13* (2006.01)
*H01L 23/49* (2006.01)
(Continued)

(52) U.S. Cl.
CPC ...... *H01L 23/49827* (2013.01); *H01L 21/486* (2013.01); *H01L 21/4853* (2013.01);
(Continued)

(58) Field of Classification Search
CPC ......... H01L 23/49827; H01L 23/49811; H01L 21/4853; H01L 23/13; H01L 23/49866;
(Continued)

(56) References Cited

U.S. PATENT DOCUMENTS

| | | | | |
|---|---|---|---|---|
| 5,528,080 A | * | 6/1996 | Goldstein | ......... H01L 21/76879 257/621 |
| 5,722,160 A | * | 3/1998 | Uemura | .................. H01L 24/73 228/180.1 |

(Continued)

FOREIGN PATENT DOCUMENTS

| | | |
|---|---|---|
| CN | 103258807 | 8/2013 |
| DE | 102009012643 | 10/2009 |
| EP | 2355140 | 8/2011 |

OTHER PUBLICATIONS

PCT Search Report and Written Opinion mailed Apr. 30, 2015 for PCT application No. PCT/US2015/014477, 11 pages.

*Primary Examiner* — Nathan Milakovich

(57) ABSTRACT

Some of the embodiments of the present disclosure provide a semiconductor package interposer comprising a substrate having a first surface and a second surface, a plurality of vias extending between the first surface and the second surface of the substrate, the plurality of vias electrically connecting electrical connectors or circuitry on the first surface of the substrate to electrical connectors or circuitry on the second surface of the substrate, and metal plugs at least partially filling the plurality of vias. At least one of (i) the first surface or (ii) the second surface of the substrate includes depressions at distal ends of the metal plugs.

14 Claims, 6 Drawing Sheets

(51) Int. Cl.
 *H05K 1/18* (2006.01)
 *H01L 23/498* (2006.01)
 *H01L 21/48* (2006.01)
 *H05K 1/03* (2006.01)
 *H05K 1/11* (2006.01)

(52) U.S. Cl.
 CPC ........ *H01L 23/13* (2013.01); *H01L 23/49811* (2013.01); *H01L 23/49866* (2013.01); *H05K 1/0306* (2013.01); *H05K 1/115* (2013.01); *H05K 1/181* (2013.01); *H01L 2224/11* (2013.01); *H05K 2201/09563* (2013.01); *H05K 2201/10242* (2013.01); *H05K 2201/10378* (2013.01); *Y10T 29/49165* (2015.01)

(58) Field of Classification Search
 CPC .... H01L 21/486; H05K 1/181; H05K 1/0306; Y10T 29/49165
 See application file for complete search history.

(56) References Cited

U.S. PATENT DOCUMENTS

| | | | |
|---|---|---|---|
| 5,783,865 A | 7/1998 | Higashiguchi et al. | |
| 6,107,109 A | 8/2000 | Akram et al. | |
| 6,114,240 A * | 9/2000 | Akram | H01L 21/486 257/E21.511 |
| 6,574,863 B2 * | 6/2003 | Tung | H05K 3/4602 29/825 |
| 6,620,731 B1 * | 9/2003 | Farnworth | H01L 21/486 257/E21.511 |
| 7,008,821 B1 * | 3/2006 | Shao | H01L 24/05 257/E23.011 |
| 7,109,060 B2 * | 9/2006 | Fukazawa | H01L 21/561 257/E21.597 |
| 7,109,068 B2 * | 9/2006 | Akram | H01L 21/76898 257/E21.59 |
| 7,155,821 B1 * | 1/2007 | Downes | H05K 1/112 29/825 |
| 7,541,677 B2 * | 6/2009 | Kawano | H01L 21/76898 257/758 |
| 7,838,994 B2 * | 11/2010 | Shibayama | G01T 1/2018 257/774 |
| 8,431,831 B2 * | 4/2013 | Sweeney | H05K 1/113 174/262 |
| 9,054,165 B2 * | 6/2015 | Pratt | H01L 21/76898 |
| 9,159,699 B2 * | 10/2015 | Tsai | H01L 24/91 |
| 2004/0178491 A1 | 9/2004 | Akram et al. | |
| 2004/0238603 A1 | 12/2004 | Saito | |
| 2009/0243100 A1 | 10/2009 | Akiyama | |
| 2010/0244247 A1 * | 9/2010 | Chang | H01L 21/76898 257/741 |
| 2011/0316169 A1 | 12/2011 | Sunohara et al. | |
| 2012/0224345 A1 * | 9/2012 | Ohtorii | G02B 6/423 361/771 |
| 2014/0145326 A1 * | 5/2014 | Lin | H01L 24/11 257/737 |
| 2014/0183744 A1 * | 7/2014 | Lee | H01L 21/563 257/762 |
| 2015/0027760 A1 * | 1/2015 | Cho | H05K 1/111 174/257 |

* cited by examiner

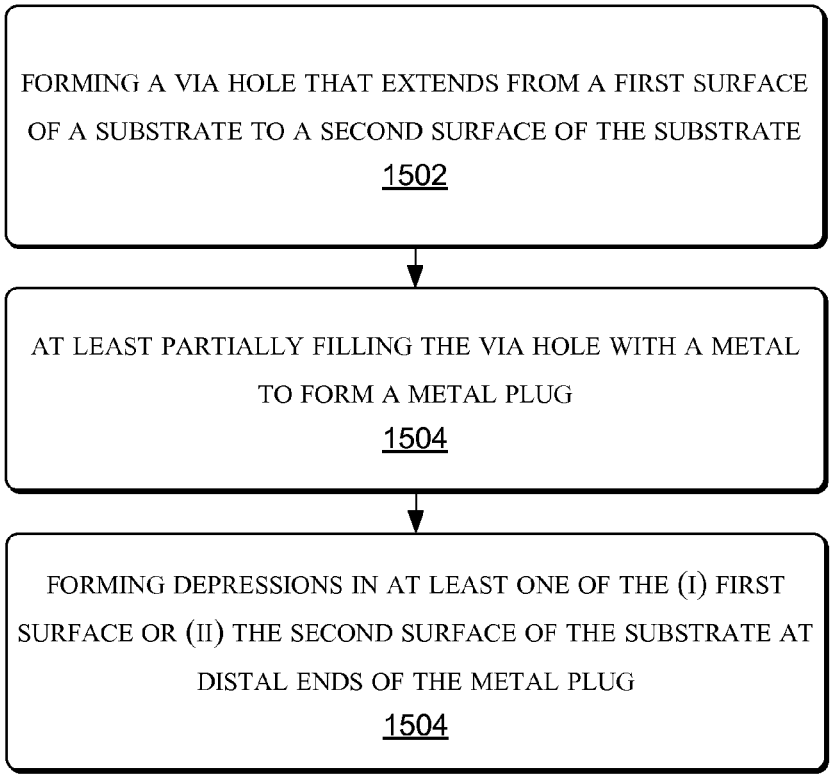

```
┌─────────────────────────────────────────────┐
│ FORMING A VIA HOLE THAT EXTENDS FROM A FIRST SURFACE │
│ OF A SUBSTRATE TO A SECOND SURFACE OF THE SUBSTRATE  │
│                    1502                              │
└─────────────────────────────────────────────┘
                        │
                        ▼
┌─────────────────────────────────────────────┐
│ AT LEAST PARTIALLY FILLING THE VIA HOLE WITH A METAL │
│            TO FORM A METAL PLUG                      │
│                    1504                              │
└─────────────────────────────────────────────┘
                        │
                        ▼
┌─────────────────────────────────────────────┐
│ FORMING DEPRESSIONS IN AT LEAST ONE OF THE (I) FIRST │
│ SURFACE OR (II) THE SECOND SURFACE OF THE SUBSTRATE AT│
│           DISTAL ENDS OF THE METAL PLUG              │
│                    1504                              │
└─────────────────────────────────────────────┘
```

METHOD AND APPARATUS FOR IMPROVING THE RELIABILITY OF A CONNECTION TO A VIA IN A SUBSTRATE

CROSS REFERENCE TO RELATED APPLICATIONS

The present disclosure claims priority to U.S. Provisional Patent Application No. 61/937,331, filed on Feb. 7, 2014, which is incorporated herein by reference.

TECHNICAL FIELD

Embodiments of the present disclosure relate to chip packaging technology for semiconductor integrated circuits, and more particularly to chip packaging technology that includes vias.

BACKGROUND

The rapidly growing portable electronics markets, e.g. cellular phones, laptop computers, and personal digital assistants (PDAs), are integral facets of modern life and each are operated by an integrated circuit (IC) with strict packaging demands. Integrated circuits have unique attributes which have significant impacts on manufacturing integration, in that integrated circuits must be generally small, lightweight, rich in functionality, and integrated circuits must be produced in high volumes at relatively low cost. For example, there is a demand for IC packages that are particularly well suited for use in devices that are small in size, such as small hand-held devices.

To meet such demand, manufacturers are integrating more circuit functions, shrinking device features, and increasing speeds. As an extension of the IC industry, the electronics packaging industry is faced with similar technological and market dynamics. From a packaging perspective, smaller form factors, requirements for more input/output signals, and power management are major technology drivers. Sophisticated new products of all types are being developed, while barriers are continually being reached with conventional IC packages and processes.

SUMMARY

In various embodiments, the present disclosure provides a semiconductor package interposer comprising a substrate having a first surface and a second surface, and a plurality of vias extending between the first surface and the second surface of the substrate. The plurality of vias electrically connects electrical connectors or circuitry on the first surface of the substrate to electrical connectors or circuitry on the second surface of the substrate. The semiconductor package interposer further comprises metal plugs at least partially filling the plurality of vias. At least one of (i) the first surface or (ii) the second surface of the substrate includes depressions at distal ends of the metal plugs.

In some embodiments, an integrated circuit package comprises at least one semiconductor die, a printed circuit board, and an interposer electrically interconnecting the at least one semiconductor die and the printed circuit board. The interposer comprises a substrate having a first surface and a second surface, and a plurality of vias extending between the first surface and the second surface of the substrate. The plurality of vias electrically connect electrical connectors or circuitry on the first surface of the substrate to electrical connectors or circuitry on the second surface of the substrate. The interposer further comprises metal plugs at least partially filling the plurality of vias. At least one of (i) the first surface or (ii) the second surface of the substrate includes depressions at distal ends of the metal plugs.

In some embodiments, a method comprises forming a via hole that extends from a first surface of a substrate to a second surface of the substrate, at least partially filling the via hole with a metal to form a metal plug, and forming depressions in at least one of the (i) first surface or (ii) the second surface of the substrate at distal ends of the metal plug.

BRIEF DESCRIPTION OF THE DRAWINGS

In the following detailed description, reference is made to the accompanying drawings which form a part hereof wherein like numerals designate like parts throughout, and in which is shown by way of embodiments that illustrate principles of the present disclosure. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

FIG. 15 is a flow diagram illustrating a process of fabricating a via connection, according to embodiments.

DETAILED DESCRIPTION

In various embodiments, an integrated circuit (IC) package comprises an IC die (e.g., IC chip) mounted on an interposer, which interposer in turn may be attached to a printed circuit board (PCB). The interposer may be wire bonded during a wire bonding process to connect input/output (I/O) pads of the IC die to external lands of the PCB, for example. In some implementations, conductive traces on the PCB may be routed to individual leads of the IC die through the interposer. The conductive traces may terminate at pin lands, which correspond to external package leads of the interposer or any other portion of the IC package. The conductive traces may be electrically connected (e.g., by pin lands) by soldering to make the electrical connections between the pin lands on the interposer and other elements mounted on the PCB.

In some implementations, the interposer may comprise a substrate having vias electrically connecting electrical connectors or circuitry on a first surface of the substrate (where an IC die may be located) to electrical connectors or circuitry on a second surface of the substrate (where a PCB may be located). The substrate may include depressions at locations where the via terminates at the first surface and/or the second surface of the substrate. For example, such depressions may comprise a portion of the surface that dips below the surface plane of the substrate. Such depressions provide a relatively large amount of surface area for contact between the substrate and a connector configuration, thereby improving mechanical strength of the connector configuration.

Moreover, a depression of the substrate at a via may provide a relatively large amount of structural support for a solder bump or other type of connection that may be used at the via. For example, a portion of a solder bump disposed in the depression may be laterally supported at sides of the depression as well as being vertically supported at the bottom of the depression. This is in contrast to a case where a solder bump, being disposed on a flat surface of a substrate, has no lateral structural support and thus may be relatively prone to being broken (or detached) from the surface of the substrate.

Figure 1:
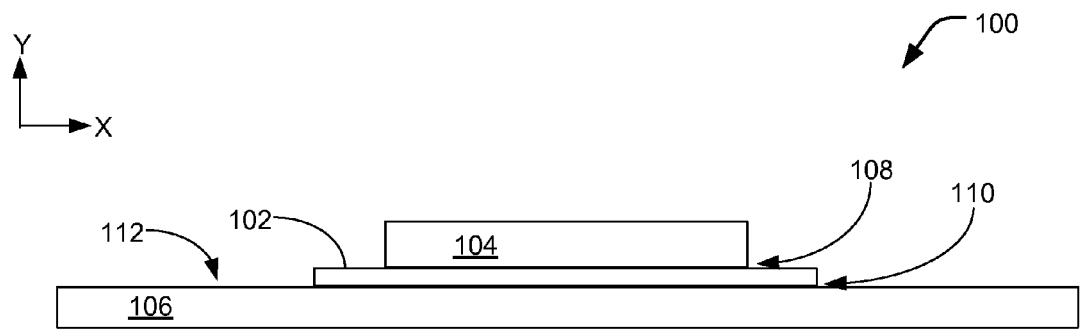
FIG. 1 is a side view of an integrated circuit package, according to some embodiments.

FIG. 1 is a side view of an IC package 100, according to some embodiments. IC package 100 may include an interposer 102, a module or IC die 104, and a PCB 106. Interposer 102 may include electrical vias (not illustrated in FIG. 1) that interconnect circuitry of IC die 104 and PCB 106. In some implementations, interposer 102 may comprise a glass substrate, an epoxy or plastic material, or a semiconductor material such as silicon. In detail, IC die 104 may be mechanically and/or electrically connected (e.g., by solder of a ball grid array) to interposer 102 at interface 108, and interposer 102 may be mechanically and/or electrically connected (e.g., by solder of a ball grid array) to PCB 106 at interface 110. Referring to orthogonal directional axes X, Y, and Z (where Z is out of the page), interface 108 lies in the X-Z plane. Electrical vias used to electrically connect circuitry at interface 108 with circuitry at interface 110 conduct electrical signals in the Y-direction. Solder bumps (e.g., micro-bumps) or a ball grid array (BGA) on a bottom surface of IC die 104 may be electrically connected to a redistribution layer (RDL), landing pads, and/or other connections on the top surface of interposer 102 at interface 108. PCB 106 may be electrically connected to an RDL, landing pads, and/or other connections on the bottom surface of interposer 102 at interface 110. A surface 112 of PCB 106 may include circuitry comprising conductive traces, for example.

Figure 2:
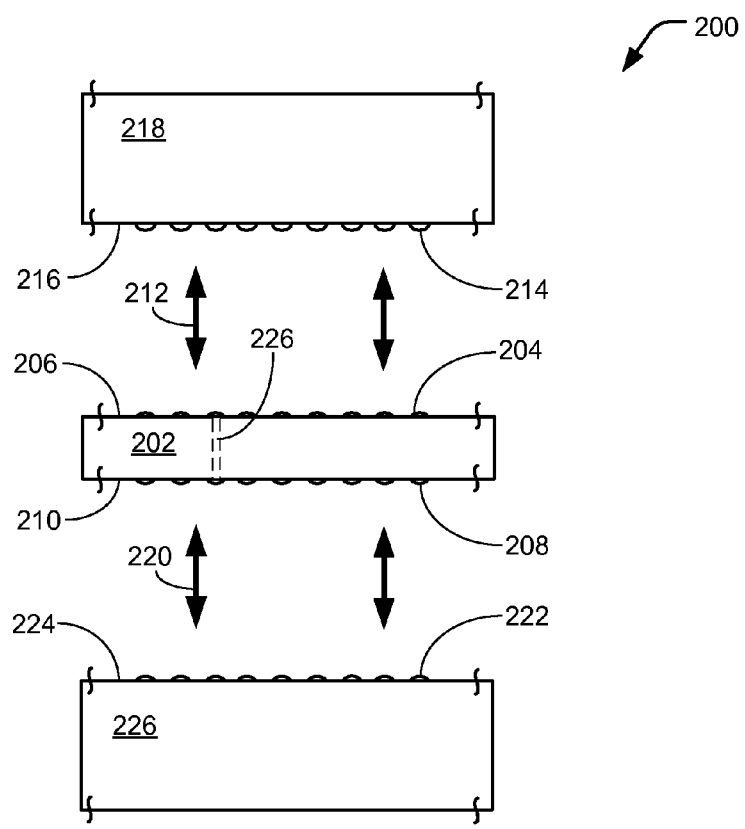
FIG. 2 is a side view of an assembly process for an integrated circuit package, according to some embodiments.

FIG. 2 is a side view of an assembly process 200 for an IC package, according to some embodiments. For example, such an IC package may be the same as or similar to IC package 100. An interposer 202 may include connectors 204 (e.g., solder bumps or pads of a BGA) on a first surface 206 and connectors 208 (e.g., solder bumps or pads of a BGA) on a second surface 210. Connectors 204 of interposer 202 may be electrically joined, as indicated by arrow 212, to connectors 214 (e.g., solder bumps or pads of a BGA) on a surface 216 of an IC die 218. Herein, "electrically joined" includes an electrical connection involving solder bumps, wires, landing pads, RDLs, conductive traces, or any combination thereof. Connectors 208 of interposer 202 may be electrically joined, as indicated by arrow 220, to connectors 222 (e.g., solder bumps or pads of a BGA) on a surface 224 of a PCB 226.

In some particular implementations, distances between adjacent connectors 204 may range from about 0.25 millimeters to about 0.4 millimeters, though this range may widely vary depending, at least in part, on the number of leads included in IC die 218, for example. Similar separation distances may apply for connectors 208, 214, and 222. Interposer 202 may include a plurality of vias 226 that extend between bumps 204 and bumps 208, for example.

Figure 3:
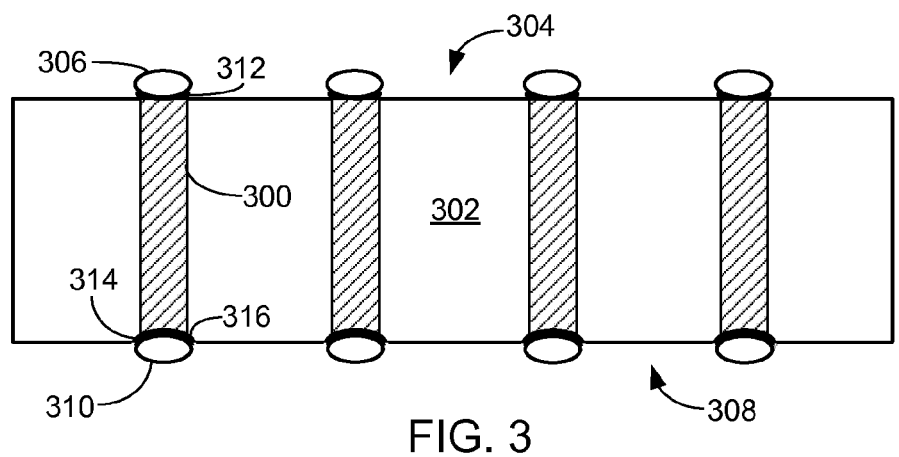
FIG. 3 is a cross-sectional view of vias disposed in an interposer, according to some embodiments.

FIG. 3 is a cross-sectional view of vias 300 disposed in an interposer 302, according to some embodiments. For example, interposer 302 may be the same as or similar to interposer 202 illustrated in FIG. 2. A first surface 304 of interposer 302 may include connectors 306 that face an IC die, such as 218 illustrated in FIG. 2. Accordingly, connectors 306 may electrically connect to connectors or other circuit elements of the IC die. A second surface 308 of interposer 302 may include connectors 310 that face a PCB, such as 226 illustrated in FIG. 2. Accordingly, connectors 310 may electrically connect to connectors or other circuit elements of the PCB. Hereinafter, connectors, such as 306 and 310, are considered to be bumps comprising solder, though the connectors may comprise any of a number of types of connectors (e.g., landing pads, RDLs, or wire ends) comprising any conductive material (e.g., copper, gold, tin, and so on).

Vias 300, which may comprise a copper-filled hole that extends through interposer 302, for example, terminate at first surface 304 and second surface 308. As described below, vias 300 terminate with a first type of connector configuration on first surface 304 and a second type of connector configuration on second surface 308 in the example embodiment of FIG. 3. In particular, the first type of connector configuration includes an under bump metallization (UBM) layer 312 and bump 306 on a terminus of via 300, which is flush with first surface 304. In contrast, the second type of connector configuration includes a UBM layer 314 and bump 310 on a terminus of via 300, which is recessed below second surface 308. For example, UBM layer 314 and at least a portion of bump 310 are disposed in depression 316.

Figure 4:
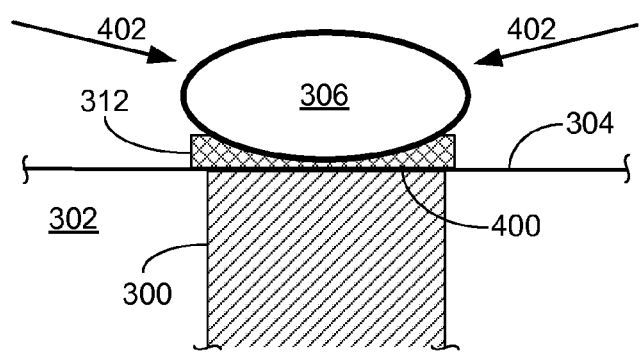
FIG. 4 is a close-up cross-sectional view of a via connection, according to some embodiments.

FIG. 4 is a close-up cross-sectional view of the first type of connector configuration illustrated in FIG. 3, according to some embodiments. The first type of connector configuration includes UBM layer 312 and bump 306 on a terminus 400 of via 300, which is flush with first surface 304 of interposer 302. The first type of connector configuration does not include a depression and, therefore, UBM layer 312 and bump 306 are on surface 304 (e.g., no portion of UBM layer 312 or bump 306 is below surface 304). Unfortunately, the first type of connector configuration may be vulnerable to physical shock, which may detach bump 306 from via 300. Such physical shock may comprise lateral forces 402 applied by connectors on an IC die connected to bump 306, for example. On the other hand, the second type of connector configuration is relatively strong against lateral forces 402.

In some embodiments, the first type of connector configuration may be less costly to fabricate compared to the second type of connector configuration. Accordingly, despite its relatively low strength, the first type of connector configuration may be used for first surface 304 for connecting to an IC die. For example, the interposer-IC die connection may be fabricated in a relatively controlled process during initial fabrication where the structure can be protected from possible physical shock (e.g., rough handling during shipping and stocking). On the other hand, a PCB may be connected to second surface 308 sometime after fabrication of the interposer-IC die package, which may be shipped to an end-user, vendor, or third-party manufacturer, for example. Thus, connectors on second surface 308 may be exposed and susceptible to mechanical shock for a time until the connectors are connected to a PCB. For at least this reason, the relatively robust second type of connector configuration, having connectors (e.g., bumps 310) on second surface 308 disposed in depressions 316, may be desirable, despite a possible greater cost (as compared to the first type of connector configuration).

Figure 5:
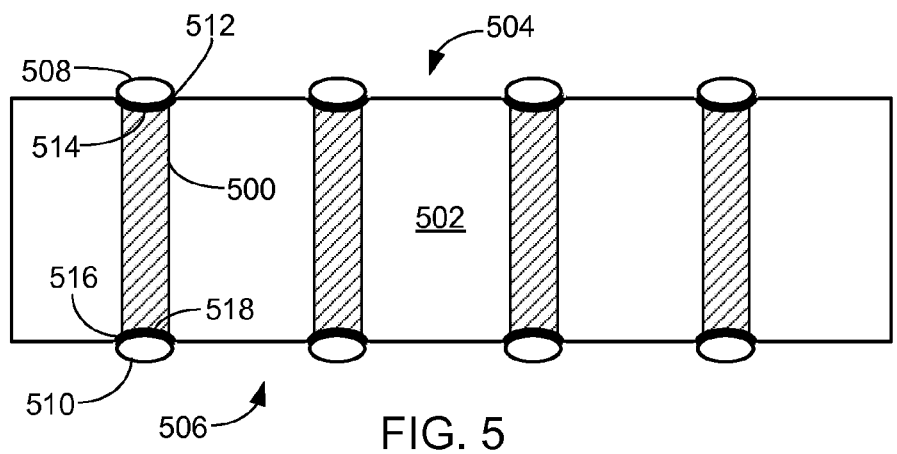
FIG. 5 is a cross-sectional view of vias disposed in an interposer, according to other embodiments.

FIG. 5 is a cross-sectional view of vias 500 disposed in an interposer 502, according to embodiments. For example, the configuration illustrated in FIG. 5 may be similar to that illustrated in FIG. 3 except that the second type of connector configuration, which includes depressions, is used on both first surface 504 and second surface 506. Interposer 502 may be the same as or similar to interposer 202. First surface 504 of interposer 502 may include bumps 508 that face an IC die, such as 218 illustrated in FIG. 2. Accordingly, bumps 508 may electrically connect to connectors or other circuit elements of the IC die. Second surface 506 of interposer 502 may include bumps 510 that face a PCB, such as 226 illustrated in FIG. 2. Accordingly, bumps 510 may electrically connect to connectors or other circuit elements of the PCB.

Vias 500, which may comprise a copper-filled hole that extends through interposer 502, for example, terminate at first surface 504 and second surface 506. Vias 500 terminate with a second type of connector configuration (as introduced above for FIG. 3) on first surface 504 and on second surface 506 in the example embodiment of FIG. 5. In particular, the second type of connector configuration includes a UBM layer 512 and bump 508 on a terminus of via 500, which is recessed below first surface 504. For example, UBM layer 512 and at least a portion of bump 508 are disposed in a depression 514. The second type of connector configuration on second surface 506 includes a UBM layer 516 and bump 510 on a terminus 600 of via 500, which is recessed below second surface 506. For example, UBM layer 516 and at least a portion of bump 510 are disposed in depression 518.

Figure 6:
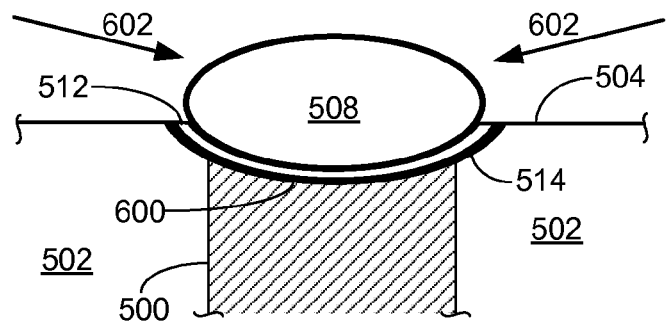
FIG. 6 is a close-up cross-sectional view of a via connection, according to embodiments.

FIG. 6 is a close-up cross-sectional view of the second type of connector configuration illustrated in FIG. 5 (and in FIG. 3), according to some embodiments. Though FIG. 6 and the associated discussion is directed to the connector configuration at first surface 504, the discussion also applies to the connector configuration at second surface 506. The second type of connector configuration includes UBM layer 512 and bump 508 on a terminus 600 of via 500, which is recessed below first surface 504 of interposer 502. The second type of connector configuration includes depression 514 and, therefore, UBM layer 512 and bump 508 are at least partially below surface 504. The second type of connector configuration may be relatively robust against physical shock, which may otherwise detach bump 508 from via 500. As mentioned above, one reason for this robustness is that depression 514 provides a greater amount of surface area for contact between interposer 502 and UBM layer 512, as compared to a flat surface sans a depression. Such physical shock may comprise lateral forces 602 applied by connectors on an IC die connected to bump 508, for example.

Figure 7:
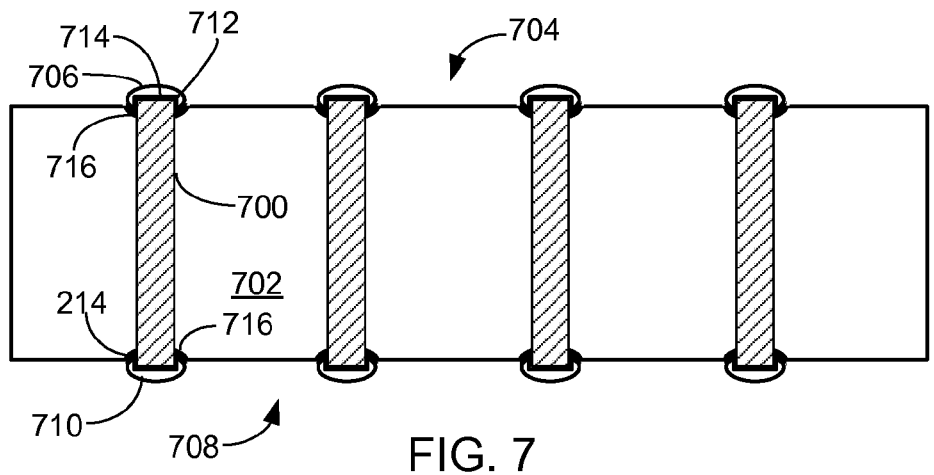
FIG. 7 is a cross-sectional view of vias disposed in an interposer, according to still other embodiments.

FIG. 7 is a cross-sectional view of vias 700 disposed in an interposer 702, according to various embodiments. For example, interposer 702 may be the same as or similar to interposer 202. A first surface 704 of interposer 702 may include bumps 706 that face an IC die, such as 218 illustrated in FIG. 2. Accordingly, bumps 706 may electrically connect to connectors or other circuit elements of the IC die. Second surface 708 of interposer 702 may include bumps 710 that face a PCB, such as 226 illustrated in FIG. 2. Accordingly, bumps 710 may electrically connect to connectors or other circuit elements of the PCB.

Vias 700, which may comprise a metal-filled (e.g., copper) hole that extends through interposer 702, for example, terminate at first surface 704 and second surface 708. Vias 700 terminate with a third type of connector configuration on first surface 704 and second surface 708. In particular, the third type of connector configuration includes a UBM layer 712 and bump 706 disposed on a terminus 714 of via 700 at a level that is at or above first surface 704. At least a portion of UBM layer 712 and at least a portion of bump 706 are disposed in a depression 716. The third type of connector configuration on second surface 708 includes a UBM layer 718 and bump 720 on a terminus (opposite terminus 714) of via 700, which is recessed below second surface 708. At least a portion of UBM layer 718 and at least a portion of bump 720 are disposed in depression 716 in second surface 708.

Figure 8:
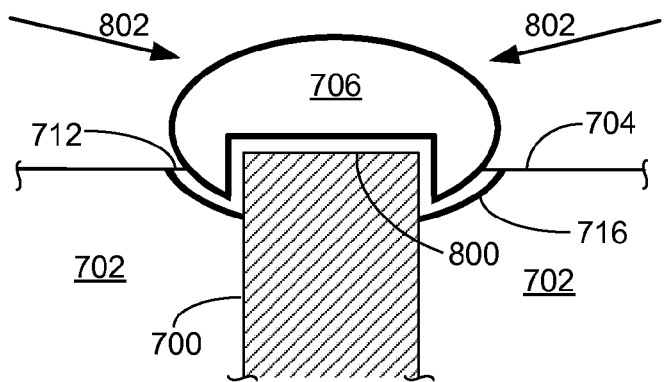
FIG. 8 is a close-up cross-sectional view of a via connection, according to embodiments.

FIG. 8 is a close-up cross-sectional view of the third type of connector configuration illustrated in FIG. 7, according to some embodiments. Though FIG. 8 and the associated discussion are directed to the connector configuration at first surface 704, the discussion also applies to the connector configuration at second surface 708. The third type of connector configuration includes UBM layer 712 and bump 706 on a terminus 800 of via 700, which is recessed below first surface 704 of interposer 702. The third type of connector configuration includes depression 716 and, therefore, UBM layer 712 and bump 706 are at least partially below surface 704. The third type of connector configuration may be relatively strong against physical shock, which may otherwise detach bump 706 from via 700. Such physical shock may comprise lateral forces 802 applied by connectors on an IC die connected to bump 706, for example.

At via terminations at the first surface 704 and the second surface 708, the metal plug (e.g., the metal that fills the via hole) of the via may extend beyond the surface of depression 716. Hereinafter, the portion of the metal plug of the via is called the metal protrusion. In some implementations, the top of terminus 800 of via 700 may extend above first surface 704 such that the metal protrusion is longer than the depth of depression 716. In other implementations, terminus 800 of via 700 may be flush with first surface 704 such that the length of the metal protrusion is the same as or similar to the depth of depression 716. In still other implementations, terminus 800 of via 700 may be below first surface 704 but above the surface of depression 716 such that the metal protrusion is shorter than the depth of depression 716. UBM layer 712 may conformally cover at least portions of the surface of depression 716 and sides and top of the metal protrusion. Bump 706 may conformally cover the metal protrusion.

In some implementations, though not illustrated in the figures, portions of bump 706 and/or UBM layer 712 may overlap onto first surface 704. This may be the case, for example, if the bump or the UBM layer is relatively large compared to the width (or diameter) of depression 716.

Figure 9:
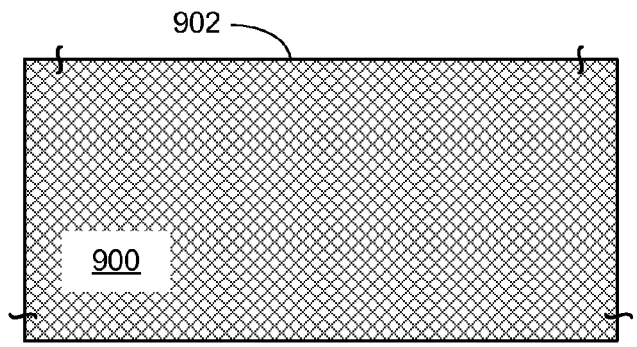
FIGS. 9-14 illustrate a process of fabricating a via connection, according to some embodiments.

FIGS. 9-14 illustrate a process of fabricating a via connection, according to some embodiments. FIG. 9 illustrates a portion of a substrate 900, which may comprise glass, plastic (e.g., an epoxy or polymer), or a semiconductor such as silicon. Substrate 900 may be a portion of an interposer, such as interposer 202 illustrated in FIG. 2, for example. Substrate 900 includes a surface 902 on which a connector will be fabricated in the process.

Figure 10:
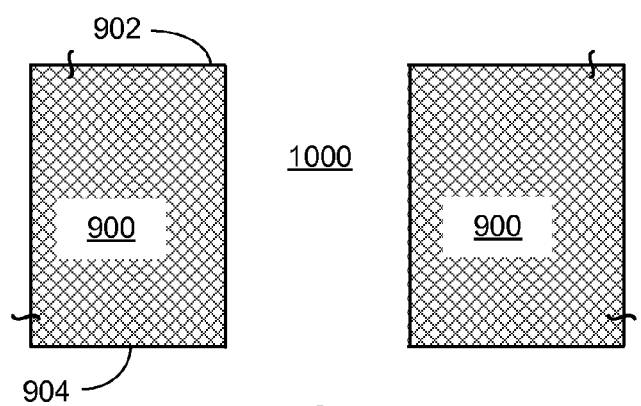

In FIG. 10, a via hole 1002 is formed in substrate 900. Via hole 1000 may extend from surface 902 to a second surface (not illustrated) opposite surface 902, though claimed subject matter is not so limited. Via hole 1000 may be formed by any of a number of techniques. For example, some techniques include a dry etching process that removes material from substrate 900 to form via hole 1000. Other techniques may use laser drilling that removes material from substrate 900 by oblation. Still other techniques may use electric discharge. Here, high voltage electrodes may be respectively placed on surface 902 and the second surface. Electric discharge may produce an arc between the electrodes. Material of substrate 900 in the vicinity of the arc may vaporize to form via hole 1000.

Figure 11:
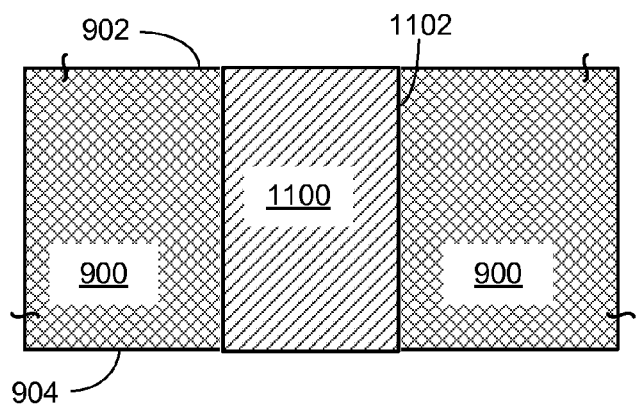

In FIG. 11, via hole 1000 may be at least partially filled with a metal plug 1100. For example, metal plug 1100 may comprise copper, gold, tin, or an alloy, just to name a few example. In some implementations, metal plug 1100 may cover walls 1102 of via hole 1000 while central portions of via hole 1000 remain free of the metal.

Figure 12:
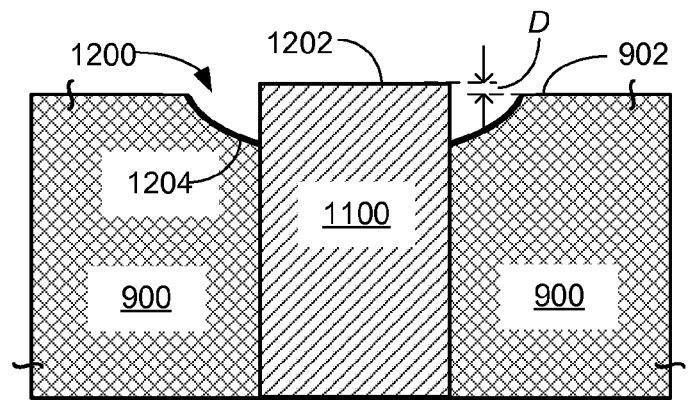

In FIG. 12, a depression 1200 may be formed in surface 902. Depression 1200 may be formed by any of a number of techniques. Some techniques, while removing material of substrate 900 to form depression 1200, may lower surface 902 while a terminus 1202 of metal plug 1100 remains unchanged. As a result, surface 902 may be below terminus 1202 by a distance D, and metal plug 1100 may protrude above a surface 1204 of depression 1200 by a distance D plus the depth of the depression. D may be several microns, for example. In other techniques, however, while removing material of substrate 900 to form depression 1200, lower surface 902 may remain unchanged while terminus 1202 of metal plug 1100 is lowered (this situation is not illustrated). As a result, surface 902 may be above terminus 1202, and metal plug 1100 may protrude above surface 1204 of depression 1200 by less than the depth of the depression.

Some techniques for forming depression 1200 may include a dry etching process that removes material from substrate 900 to form depression 1200. Such dry etching may use a lithographic process to etch the region in the vicinity of terminus 1202. Metal plug 1100 may be resistant to the dry etching process. Other techniques may use wet etching, such as in the case of a hydrofluoric acid etchant for substrate 900 comprising glass. Still other techniques may use laser oblation to remove material from substrate 900. For example, a laser may be focused onto surface 902 to have a beam width the same as or similar to a desired width of depression 1200. The beam may be at least approximately centered on terminus 1202. Surface 902, in the vicinity of terminus 1202, may be exposed for a predetermined time to the laser beam. Exposure time may at least partially determine depth of resulting depression 1200. In some example embodiments, a width and/or diameter of depression 1200 may be in a range from about 20 micrometers to about 120 micrometers.

Yet other techniques for forming depression 1200 may use electric discharge. Here, high voltage electrodes may be respectively placed relatively near each other on surface 902. Electric discharge may produce an arc between the electrodes. Material of substrate 900 in the vicinity of the arc may vaporize to form depression 1200.

Figure 13:
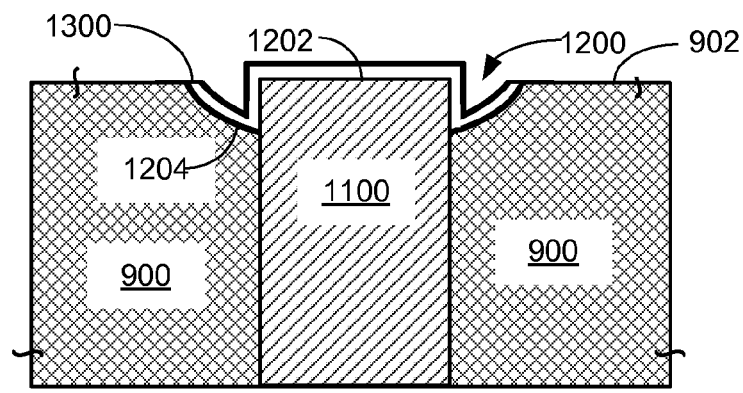

In FIG. 13, a UBM layer 1300 may be formed to conformally cover surface 1204 of depression 1200 and sides and top of the protrusion of metal plug 1100. In some example embodiments, thickness of UBM layer 1300 may be in a range from about 4 micrometers to about 20 micrometers. UBM layer 1300 may improve adhesion and wettability of solder to substrate 900 or to metal plug 1100, for example. UBM layer 1300 may comprise one or more layers of various metals and alloys, such as chromium, copper, nickel, vanadium, titanium, gold, tungsten, and so on, which may be applied by a sputtering process, for example.

Figure 14:
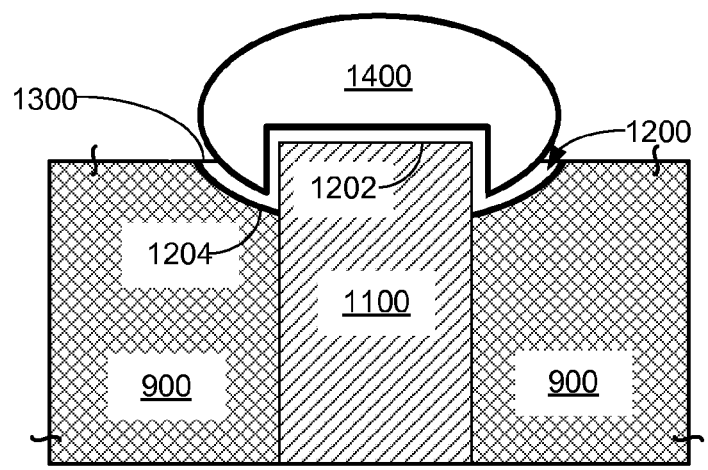

In FIG. 14, a bump 1400 may be formed to cover terminus 1202 and to at least partially fill depression 1200. Bump 1400 may comprise solder, for example. As described above, for example, bump 1400 may be used to connect metal plug 1100 to connectors or RDLs of an IC chip, such as IC chip 218 of FIG. 2. In such a case, bump 1400 may be the same as or similar to bump 204, illustrated in FIG. 2.

FIG. 15 is a flow diagram illustrating a process 1500 for fabricating a via connection, according to embodiments. For example, such a via connection may be the same as or similar to the first connection configuration (e.g., as illustrated in FIG. 4), second connection configuration (e.g., as illustrated in FIG. 6), or third connection configuration (e.g., as illustrated in FIG. 8), described above. At block 1502, a via hole is formed to extend from a first surface of a substrate to a second surface of the substrate. An example of forming the via hole is described with respect to FIG. 10. At block 1504, the via hole is at least partially filled with a metal to form a metal plug. An example of partially fill a via hole with metal is described with respect to FIG. 11. At block 1506, depressions are formed in at least one of the (i) first surface or (ii) the second surface of the substrate at distal ends of the metal plug. An example of forming such depressions is described with respect to FIG. 12.

The description incorporates use of the phrases "in an embodiment," or "in various embodiments," which may each refer to one or more of the same or different embodiments. Furthermore, the terms "comprising," "including," "having," and the like, as used with respect to embodiments of the present disclosure, are synonymous.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments. Additionally, although various embodiments of an interposer are described and illustrated as having various types of connector configurations located of both sides (or surfaces) of an interposer, in some embodiments, only one surface (or side) of an interposer includes a particular connector configuration as described herein while the opposing surface may include a connector configuration according to conventional techniques.

Although specific embodiments have been illustrated and described herein, it is noted that a wide variety of alternate and/or equivalent implementations may be substituted for the specific embodiment shown and described without departing from the scope of the present disclosure. The present disclosure covers all methods, apparatus, and articles of manufacture fairly falling within the scope of the appended claims either literally or under the doctrine of equivalents. This application is intended to cover any adaptations or variations of the embodiment disclosed herein. Therefore, it is manifested and intended that the present disclosure be limited only by the claims and the equivalents thereof.

What is claimed is:

1. A semiconductor package interposer comprising:
a substrate having a first surface and a second surface;
a plurality of vias extending between the first surface and the second surface of the substrate, the plurality of vias electrically connecting electrical connectors or circuitry on the first surface of the substrate to electrical connectors or circuitry on the second surface of the substrate;
metal plugs at least partially filling the plurality of vias;
depressions in the first surface of the substrate at distal ends of the metal plugs, wherein the metal plugs (i) extend beyond bottoms of the depressions and (ii) are separated from the substrate in the depressions; and
solder bumps that (i) cover the distal ends and (ii) at least partially fill the depressions between sides of the metal plugs and the sides of the depressions;
wherein the metal plugs extend beyond (i) tops of the depressions and (ii) the first surface of the substrate.

2. The semiconductor package interposer of claim 1, further comprising:
an under bump metallization (UBM) layer disposed in the depressions.

3. The semiconductor package interposer of claim 1, wherein the substrate comprises glass.

4. An integrated circuit package comprising:
at least one semiconductor die;
a printed circuit board;
an interposer electrically interconnecting the at least one semiconductor die and the printed circuit board, the interposer comprising:
a substrate having a first surface and a second surface;
a plurality of vias extending between the first surface and the second surface of the substrate, the plurality of vias electrically connecting electrical connectors or circuitry on the first surface of the substrate to electrical connectors or circuitry on the second surface of the substrate;
metal plugs at least partially filling the plurality of vias;
depressions in the first surface of the substrate at distal ends of the metal plugs, wherein the metal plugs (i) extend beyond bottoms of the depressions and (ii) are separated from the substrate in the depressions; and
solder bumps that (i) cover the distal ends and (ii) at least partially fill the depressions between sides of the metal plugs and the sides of the depressions;
wherein the metal plugs extend beyond (i) tops of the depressions and (ii) the first surface of the substrate.

5. The integrated circuit package of claim 4, further comprising:
an under bump metallization (UBM) layer disposed in the depressions.

6. The integrated circuit package of claim 4, wherein the substrate comprises glass.

7. A method comprising:
forming a via hole that extends from a first surface of a substrate to a second surface of the substrate;
at least partially filling the via hole with a metal to form a metal plug;
forming a depression in the first surface of the substrate at a distal end of the metal plug, wherein the depression has a depth such that the metal plug extends above a bottom of the depression, and wherein the metal plug is separated from the substrate in the depression; and
forming a solder bump that (i) covers the distal end and (ii) at least partially fills the depression between a side of the metal plug and the side of the depression;
wherein the metal plug extends beyond a top of the depression and the first surface of the substrate.

8. The method of claim 7, wherein forming the depression comprises:
laser drilling a portion of (i) the substrate and (ii) the metal plug.

9. The method of claim 7, wherein forming the depression comprises:
dry etching a portion of the substrate.

10. The method of claim 7, further comprising:
forming an under bump metallization (UBM) layer in the depression.

11. The method of claim 7, wherein the substrate comprises glass.

12. The semiconductor package interposer of claim 1, further comprising:
an under bump metallization (UBM) layer disposed (i) in the depressions and (ii) on at least a portion of the metal plugs.

13. The integrated circuit package of claim 4, further comprising:
an under bump metallization (UBM) layer disposed (i) in the depressions and (ii) on at least a portion of the metal plugs.

14. The method of claim 7, further comprising:
forming an under bump metallization (UBM) layer disposed (i) in the depression and (ii) on at least a portion of the metal plug.

* * * * *